(12) United States Patent
Yamashiro et al.

(10) Patent No.: US 11,063,122 B2
(45) Date of Patent: Jul. 13, 2021

(54) SILICON CARBIDE SEMICONDUCTOR DEVICE AND POWER CONVERSION DEVICE

(71) Applicant: Mitsubishi Electric Corporation, Chiyoda-ku (JP)

(72) Inventors: Yusuke Yamashiro, Tokyo (JP); Kazuyuki Sugahara, Tokyo (JP); Hiroshi Watanabe, Tokyo (JP); Kohei Ebihara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 126 days.

(21) Appl. No.: 16/323,642

(22) PCT Filed: Oct. 24, 2017

(86) PCT No.: PCT/JP2017/038294
§ 371 (c)(1),
(2) Date: Feb. 6, 2019

(87) PCT Pub. No.: WO2018/084020
PCT Pub. Date: May 11, 2018

(65) Prior Publication Data
US 2020/0127098 A1    Apr. 23, 2020

(30) Foreign Application Priority Data
Nov. 1, 2016  (JP) .............................. JP2016-214069

(51) Int. Cl.
*H01L 29/16* (2006.01)
*H01L 29/47* (2006.01)
(Continued)

(52) U.S. Cl.
CPC .......... *H01L 29/1608* (2013.01); *H01L 29/47* (2013.01); *H01L 29/7801* (2013.01);
(Continued)

(58) Field of Classification Search
CPC .......... H01L 29/7801; H01L 29/41741; H01L 29/7806; H01L 29/7811; H01L 29/7395;
(Continued)

(56) References Cited

U.S. PATENT DOCUMENTS

2012/0146055 A1* 6/2012 Mitani ................ H01L 29/0619
257/77
2012/0193643 A1* 8/2012 Masuda .............. H01L 29/1095
257/77
(Continued)

FOREIGN PATENT DOCUMENTS

JP       4-346477 A     12/1992
WO   WO 2014/162969 A1  10/2014

OTHER PUBLICATIONS

International Search Report dated Nov. 28, 2017 in PCT/JP2017/038294 filed Oct. 24, 2017.

*Primary Examiner* — Shahed Ahmed
(74) *Attorney, Agent, or Firm* — Xsensus LLP

(57) ABSTRACT

In a termination region of a SiC-MOSFET, suppressing operation of a p-n diode between a well and a drift layer sometimes decreases reliability during high-speed switching. In a termination region of a SiC-MOSFET with a built-in SBD are provided second well region having an impurity concentration lower than the impurity concentration in a well region in an active region, and a high-concentration region that is formed on a surface layer of the second well region, has an impurity concentration higher than the impurity concentration in the well region in the active region, and is ohmic-connected to a source electrode.

6 Claims, 7 Drawing Sheets

(51) Int. Cl.
  *H01L 29/78* (2006.01)
  *H01L 29/868* (2006.01)
  *H01L 29/872* (2006.01)
  *H02M 7/5387* (2007.01)

(52) U.S. Cl.
  CPC .......... *H01L 29/868* (2013.01); *H01L 29/872* (2013.01); *H02M 7/53871* (2013.01)

(58) Field of Classification Search
  CPC ................................ H01L 29/16–1608; H01L 29/66053–29/66068; H01L 21/0445–21/0495; H01L 21/18–21/326; H02M 7/53871; H02M 7/003; Y02B 70/10
  See application file for complete search history.

(56) References Cited

U.S. PATENT DOCUMENTS

2014/0197422 A1* 7/2014 Wada .................. H01L 29/6606
  257/77
2016/0079411 A1* 3/2016 Hino ........................ H01L 29/47
  257/77
2017/0098647 A1* 4/2017 Uchida ............... H01L 29/1608
2019/0386096 A1* 12/2019 Takeuchi ............ H01L 29/6606

* cited by examiner

F I G. 3
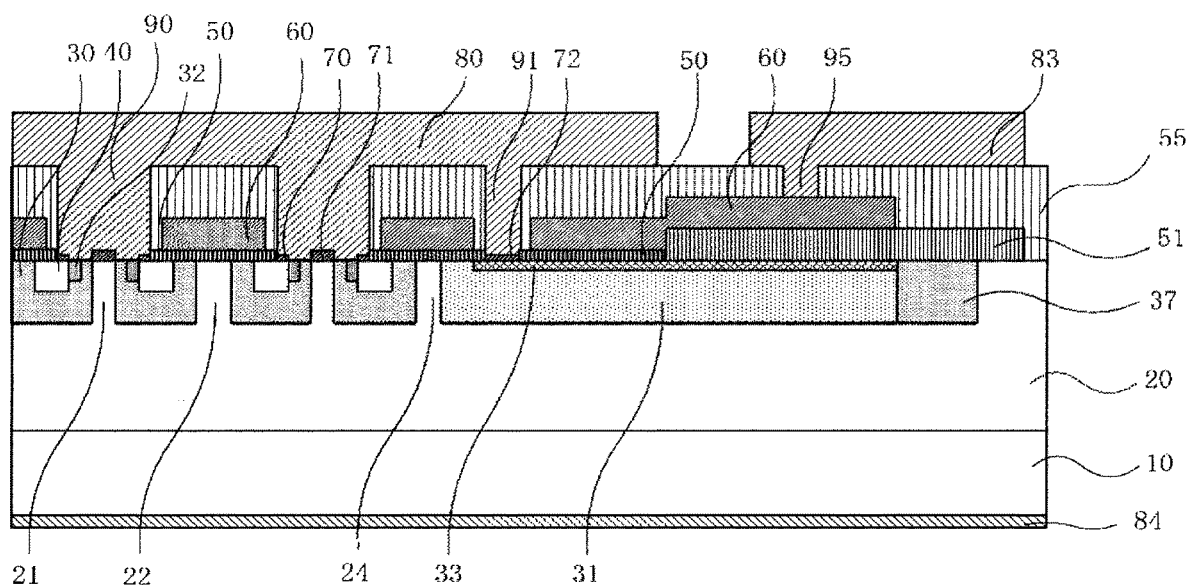
F I G. 4
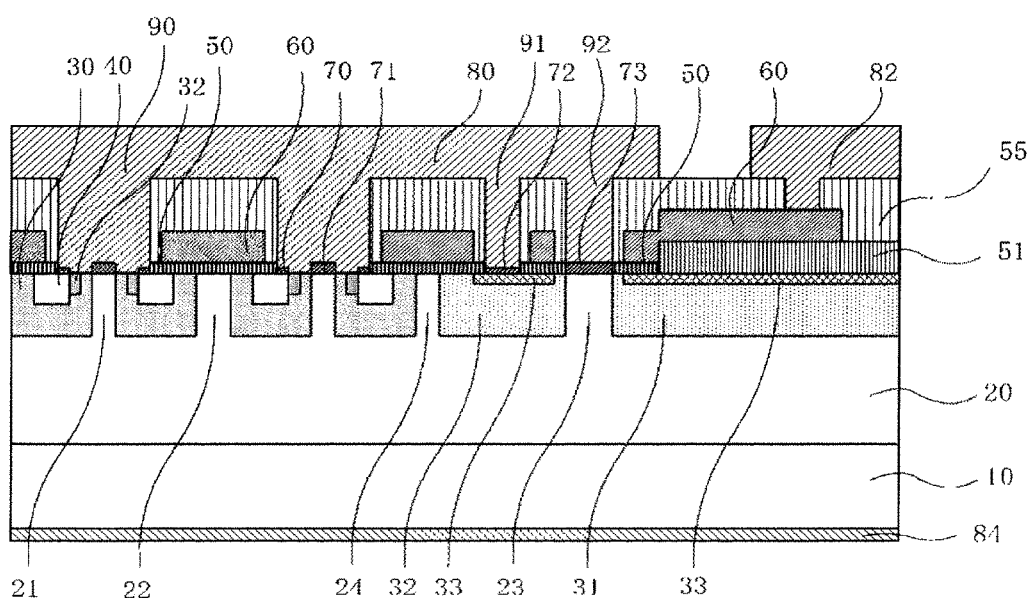

SILICON CARBIDE SEMICONDUCTOR DEVICE AND POWER CONVERSION DEVICE

TECHNICAL FIELD

The present invention relates to a silicon carbide semiconductor device made of silicon carbide and a power conversion device.

BACKGROUND ART

In semiconductor devices such as a metal-oxide-semiconductor field-effect-transistor (MOSFET), it is possible to use a built-in diode as a free wheel diode. For example, Patent Document 1 proposes a method of using, as the free wheel diode, a Schottky barrier diode (SBD) that is built in a unit cell of a MOSFET.

A p-n diode is built in a semiconductor device such as a MOSFET. Therefore, when the built-in p-n diode operates while a voltage in the forward direction is applied to the p-n diode, minority carriers are injected into a drift layer.

These injected minority carriers are known to be recombined with majority carriers in the drift layer, accompanied by generation of recombination energy, which disturbs the periodic structure of some semiconductors, or causes crystal defects. Particularly, a silicon carbide semiconductor has large recombination energy due to its large band gap and also has various stable crystal structures, so that the crystal structures are easily changed and crystal defects are likely to be caused by the operation of the p-n diode.

The silicon carbide semiconductor having disturbed crystal structures electrically has high resistance, so that such a phenomenon that occurs particularly in an active region, that is, a region that includes a unit cell having a channel, of the MOSFET increases ON-resistance, that is, device resistance to current in the forward direction between a source and a drain and increases the conduction loss during application of current with the same current density.

The conduction loss is one of dominant losses in the MOSFET, so that the generation of crystal defects in the MOSFET caused by the operation of the p-n diode in the active region enhances generation of heat of the MOSFET, causing a problem of making long-term stable operation of the MOSFET difficult.

When a SBD is built in the active region of the MOSFET, designing the diffusion potential of the SBD lower than the diffusion potential of a p-n junction allows unipolar current to flow into the built-in SBD during free-wheeling operation before the p-n diode in the active region operates. Accordingly, for a certain amount of current, free-wheeling current is allowed to pass without the operation of the p-n diode to enable avoidance of an increase in ON-resistance.

A termination region of the MOSFET, however, sometimes has a region only formed of the p-n junction, and thus, Patent Document 1 discloses a configuration including the SBD also in the termination region of the MOSFET in order to suppress variation of the operation of the p-n diode in the termination region and the p-n diode within the MOSFET in the active region near to the termination region.

Patent Document 1 also discloses a structure including a high-resistance contact part between a p-type region of the p-n diode formed in the termination region and a source electrode to reduce current flowing into the p-n junction and thus suppress the operation of the p-n diode in the termination region.

PRIOR ART DOCUMENT

Patent Document

Patent Document 1: WO2014/162969

SUMMARY

Problem to be Solved by the Invention

The SiC-MOSFET, however, is capable of reducing the switching loss by accelerating switching speed and thus performs high-speed switching in many cases. Under the circumstances, the structure described in Patent Document 1 that includes the high-resistance contact part between the p-type region of the p-n diode formed in the termination region and the source electrode increases voltage that is generated in the p-type region and is proportional with the switching speed dV/dt, to possibly cause an insulation breakdown between the p-type region and a structure on the p-type region.

The present invention has been made to solve the above problem, and an object of the present invention is to provide a silicon carbide semiconductor device that increases reliability of high-speed switching while suppressing an increase in ON-resistance.

Means to Solve the Problem

A silicon carbide semiconductor device according to the present invention includes: a semiconductor substrate made of a first conductivity type silicon carbide; a drift layer formed on the semiconductor substrate and made of a first conductivity type silicon carbide; a plurality of first well regions of a second conductivity type that are provided separately from each other on a surface layer of the drift layer; a first separation region of a first conductivity type formed, in each of the first well regions, to penetrate along depth of the first well region from a surface layer of the first well region; a source region of a first conductivity type formed, on the surface layer of the first well region, to sandwich the first separation region with another source region in a plan view; a first Schottky electrode provided on first separation region and Schottky-connected to the first separation region; a first ohmic electrode formed on the source region and ohmic-connected to the source region; a second separation region of a first conductivity type provided between the plurality of first well regions on the surface layer of the drift layer, a second well region of a second conductivity type that is formed away from the first well region on the surface layer of the drift layer, has an area larger than an area of the first well region, and has a second conductivity-type impurity concentration lower than a second conductivity-type impurity concentration in the first well region; a high-concentration region of a second conductivity type that is formed on a surface layer in the second well region and includes a second conductivity-type impurity having an impurity concentration higher than the second conductivity-type impurity concentration in the first well region; a second ohmic electrode that is formed on the high-concentration region, has a planar area smaller than a planar area of high-concentration region, and is ohmic-connected to the high-concentration region; a gate insulating film formed on surfaces of the second separation region, the first well region, a part of the source region, and the second well region; a gate electrode formed on the gate insulating film on the first well region and the second well region or the high-concentration region; a source electrode connected to the first Schottky electrode, the first ohmic electrode, and the second ohmic electrode and ohmic-connected to the first well region and the second well region; a gate pad connected to the gate electrode; and a drain electrode ohmic-connected to the semiconductor substrate.

Effects of the Invention

The silicon carbide semiconductor device according to the present invention is capable of increasing reliability during high-speed switching while suppressing an increase in ON-resistance.

BRIEF DESCRIPTION OF DRAWINGS

FIG. 3 is a schematic sectional view of the silicon carbide semiconductor device according to the first embodiment of the present invention.

FIG. 4 is a schematic sectional view of a silicon carbide semiconductor device according to a second embodiment of the present invention.

DESCRIPTION OF EMBODIMENTS

Figure 1:
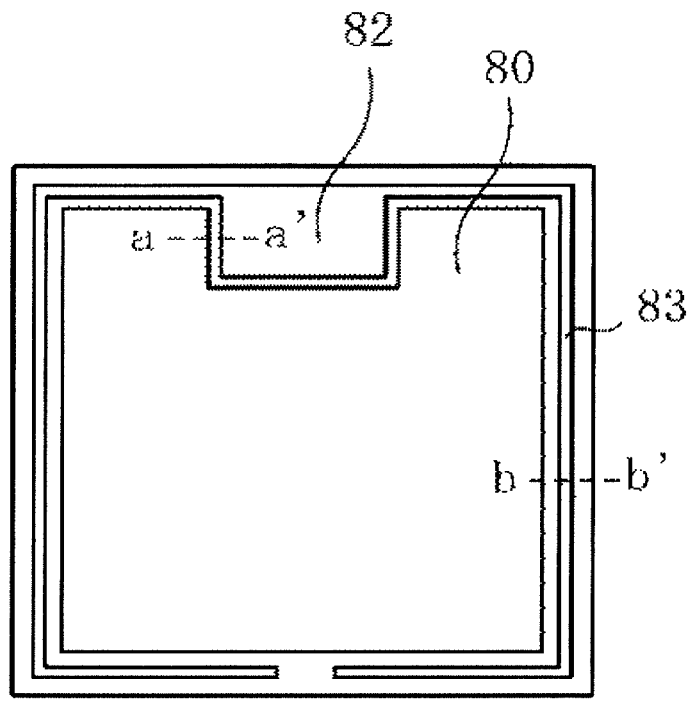
FIG. 1 is a schematic top plan view of a silicon carbide semiconductor device according to a first embodiment of the present invention.

Hereinafter, the embodiments are described with reference to the accompanying drawings. The drawings schematically show the embodiments, and the size and the mutual positional relationship of images shown in different drawings are not necessarily drawn precisely and can be appropriately changed. Further, in the description below, similar constituent elements are shown in the drawings with the same reference signs given thereto, and these constituent elements are also to be named and to function similarly. Accordingly, detailed description on these similar constituent elements is sometimes omitted.

First Embodiment

First described is a configuration of a silicon carbide semiconductor device according to a first embodiment of the present invention.

FIG. 1 is a schematic top plan view of a silicon carbide MOSFET with a built-in Schottky barrier diode (SBD) (a SiC-MOSFET with a built-in SBD) as the silicon carbide semiconductor device according to the first embodiment. In FIG. 1, a gate pad 82 is formed in a part of an upper surface of the SiC-MOSFET and a source electrode 80 is formed adjacent to the gate pad. Further, gate wiring 83 is formed to extend from the gate pad 82.

Figure 2:
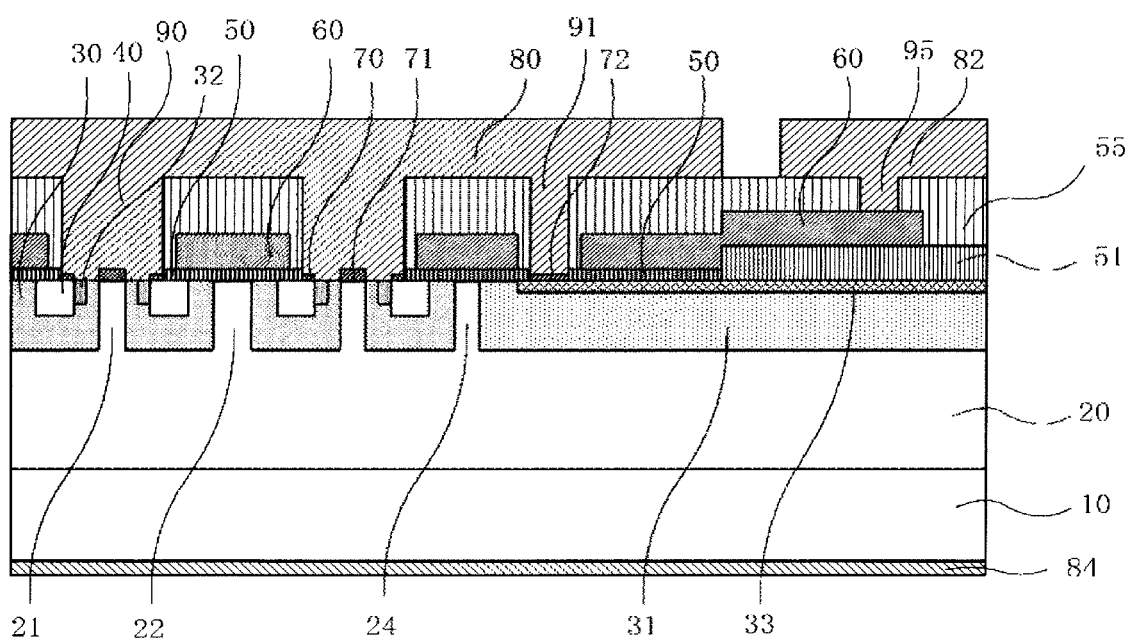
FIG. 2 is a schematic sectional view of the silicon carbide semiconductor device according to the first embodiment of the present invention.

FIG. 2 is a schematic sectional view schematically showing the section along the a-a' part from the gate pad 82 to the source electrode 80 in FIG. 1. FIG. 3 is a schematic sectional view schematically showing the section along the b-b' part from the source electrode 80 to the gate wiring 83 in an outer peripheral part of the device in FIG. 1.

In FIGS. 2 and 3, a drift layer 20 made of n-type silicon carbide is formed on a surface of a semiconductor substrate 10 made of n-type low-resistance silicon carbide. A second well region 31 made of p-type silicon carbide is provided on a surface layer part of the drift layer 20, at a position almost corresponding to a region in which the gate pad 82 described in FIG. 1 is provided.

Under a region in which the source electrode 80 described in FIG. 1 is provided, a plurality of first well regions 30 made of p-type silicon carbide are provided on a surface layer part of the drift layer 20. On a surface layer part of each of the first well regions 30, a source region 40 made of n-type silicon carbide is formed at a position inward from an outer periphery of the first well region 30 by a prescribed distance.

A contact region 32 made of low-resistance p-type silicon carbide is formed on a surface layer part of the first well region 30 further inside the source region 40 on the surface layer part of each of the first well regions 30, and a first separation region 21 that penetrates the first well region 30 and is made of silicon carbide is formed further inside the contact region. The first separation region 21 is of n-type as in the drift layer 20 and has the same impurity concentration as the drift layer 20.

A first Schottky electrode 71 Schottky-connected to the first separation region 21 is formed on a surface side of the first separation region 21.

A first ohmic electrode 70 is formed on a surface of the source region 40, and the source electrode 80 is formed that is connected to the first ohmic electrode 70, the first Schottky electrode 71, and the contact region 32.

Formed as a second separation region 22 is a region that is located between and separates adjacent first well regions 30 in the drift layer 20, and the second separation region is of n-type as in the drift layer 20 and has the same impurity concentration as the drift layer 20. A gate insulating film 50 is formed on surfaces of the first well regions 30 adjacent to each other, the second separation region 22 between the first well regions, and the source region 40 in each of the first well regions 30, and a gate electrode 60 is formed on the gate insulating film 50 at least on the first well regions 30.

Referred to as a channel region is the surface layer part of the first well region 30 that faces the gate electrode 60 under a place in which the gate electrode is formed, with the gate insulating film 50 interposed between the surface layer part and the gate electrode.

A fourth separation region 24 is formed between the first well region 30 on the outermost periphery and the second well region 31, and the fourth separation region 24 is of n-type as in the drift layer 20 and has a impurity concentration similar to that of the drift layer 20.

The second well region 31 has a p-type impurity concentration lower than the p-type impurity concentration in the first well region 30. A p-type high-concentration region 33 having a p-type impurity concentration higher than that of the second well region 31 is formed on a surface layer part of the second well region 31. The high-concentration region 33 may be formed in most of a planar region of the second well region 31 and only needs to be formed in a region half or more of the area of the second well region 31.

The gate insulating film 50 or a field insulating film 51 having a film thickness larger than that of the gate insulating film is formed on a surface of the second well region 31, and the gate electrode 60 is formed on the insulating films. An opening is formed in a part of the gate insulating film 50 or the field insulating film 51 on the surface of the second well region 31, and a second ohmic electrode 72 ohmic-connected to the high-concentration region 33 is formed in the opening. The source electrode 80 connected to, for example, the first ohmic electrode 70 is formed on the second ohmic electrode 72. The second ohmic electrode 72 has a planar area smaller than that of the high-concentration region 33.

An interlayer insulating film 55 is formed between the gate electrode 60 and the source electrode 80. In FIG. 2, the gate electrode 60 and the gate pad 82 that are located above the second well region 31 are connected to each other through a gate contact hole 95 formed in the interlayer insulating film 55. In FIG. 3, the gate electrode 60 and the gate wiring 83 that are located above the second well region 31 are connected to each other through the gate contact hole 95 formed in the interlayer insulating film 55, and a JTE region 37 that is of p-type and is made of silicon carbide is formed on an outer peripheral side of the second well region 31, that is, on a side of the second well region opposite to the first well region 30, on a surface layer part of the drift layer 20. The JTE region 37 has an impurity concentration lower than the impurity concentration in the second well region 31.

Next described is a method of manufacturing the SiC-MOSFET with the built-in SBD as the silicon carbide semiconductor device according to the present embodiment.

A drift layer 20 that has an impurity concentration of $1\times10^{15}$ to $1\times10^{17}$ cm$^{-3}$, is of n-type, has a thickness of 5 to 50 μm, and is made of silicon carbide is epitaxially grown on a semiconductor substrate 10 whose first main surface has, as a plane direction, the (0001) plane with an off-angle, has the polytype 4H, and is made of n-type low resistance silicon carbide by a chemical vapor deposition method (CVD method).

Subsequently, an implantation mask is formed in a prescribed region on a surface of the drift layer 20 by, for example, photoresist, and p-type impurity Al (aluminum) is ion-implanted. At this time, the depth of the ion implantation of Al is set at about 0.5 to 3 μm that does not exceed the thickness of the drift layer 20. The ion-implanted Al has an impurity concentration in the range of $1\times10^{17}$ or more and $1\times10^{19}$ cm$^{-3}$ or less that is a second impurity concentration higher than the first impurity concentration in the drift layer 20. Then, the implantation mask is removed. The region in which Al is ion-implanted by this step is a first well region 30.

Subsequently, an implantation mask is similarly formed on the surface of the drift layer 20 by, for example, photoresist, and p-type impurity Al is ion-implanted. At this time, the depth of the ion implantation of Al is set at about 0.5 to 3 μm that does not exceed the thickness of the drift layer 20. The ion-implanted Al has an impurity concentration in the range of $1\times10^{16}$ to $1\times10^{18}$ cm$^{-3}$ that is higher than the first impurity concentration in the drift layer 20 but lower than the second impurity concentration in the first well region 30.

Then, the implantation mask is removed. The region in which Al is ion-implanted by this step is a second well region 31.

Next, an implantation mask is formed on the surface of the drift layer 20 by, for example, photoresist, and p-type impurity Al is ion-implanted. At this time, the depth of the ion implantation of Al is set at about 0.5 to 3 μm that does not exceed the thickness of the drift layer 20. The ion-implanted Al has an impurity concentration in the range of $1\times10^{16}$ to $1\times10^{18}$ cm$^{-3}$ that is higher than the first impurity concentration in the drift layer 20 but lower than the second impurity concentration in the first well region 30.

Then, the implantation mask is removed. The region in which Al is ion-implanted by this step is a JTE region 37.

Subsequently, an implantation mask is formed by, for example, photoresist to open a prescribed place in the first well region 30 on the surface of the drift layer 20, and n-type impurity N (nitrogen) is ion-implanted. The depth of the ion implantation of N is shallower than the thickness of the first well region 30. The ion-implanted N has an impurity concentration in the range of $1\times10^{18}$ to $1\times10^{21}$ cm$^{-3}$ that exceeds the p-type second impurity concentration in the first well region 30. A source region 40 is a region of the n-type in the region in which N is implanted by this step.

Next, an implantation mask is formed by, for example, photoresist to open a prescribed place in the first well region 30 on the surface of the drift layer 20, and p-type impurity Al is ion-implanted. The region in which Al is implanted by this step is a contact region 32. The contact region 32 is provided to give good electrical contact between the first well region 30 and a source-end first ohmic electrode 70, and the contact region 32 is set to have a p-type impurity concentration higher than the p-type second impurity concentration in the first well region 30.

Subsequently, an implantation mask is formed by, for example, photoresist to open a prescribed place in the second well region 31 on the surface of the drift layer 20, and p-type impurity Al is ion-implanted. The region in which Al is implanted by this step is a high-concentration region 33. The high-concentration region 33 is provided to give good electrical contact between the second well region 31 and the source-end first ohmic electrode 70, and the high-concentration region 33 is set to have a p-type impurity concentration higher than both the p-type impurity concentration in the second well region 31 and the p-type impurity concentration in the first well. The high-concentration region 33 may have a p-type impurity concentration in the range of, for example, $1\times10^{18}$ cm$^{-3}$ or more and $1\times10^{21}$ cm$^{-3}$ or less.

Next, annealing is performed by a heat treatment device in an atmosphere of inert gas such as argon (Ar) gas at a temperature of 1300 to 1900° C. for 30 seconds to one hour. The annealing electrically activates ion-implanted N and Al.

Subsequently, a field insulating film 51 that has a film thickness of 0.5 to 2 μm and is made of silicon dioxide is formed, by a CVD method, a photolithography technique, or the like, in a region except an active region almost corresponding to the region in which the first well region 30 is formed, on the silicon carbide semiconductor layer. At this time, for example, the field insulating film 51 may be formed on the entire surface of the silicon carbide semiconductor layer and then removed at the position almost corresponding to the active region by a photolithography technique, etching, or the like.

Next, a surface of the silicon carbide semiconductor layer that is not covered with the field insulating film 51 is thermally oxidized to form, as a gate insulating film 50, a silicon oxide film having a prescribed thickness. Subsequently, a conductive polycrystalline silicon film is formed on the gate insulating film 50 and the field insulating film 51 by a low-pressure CVD method and patterned to form a gate electrode 60. Next, an interlayer insulating film 55 made of silicon oxide is formed by a low-pressure CVD method. Subsequently, a first contact hole 90 is formed that penetrates the interlayer insulating film 55 and the gate insulating film 50 and reaches the contact region 32 and the source region 40 in the active region, and a second contact hole 91 is simultaneously formed that reaches the high-concentration region 33. The top area of the second contact hole 91 is smaller than the top area of the high-concentration region 33 and is ½ or less, more desirably ¹⁄₁₀ or less of the area of the high-concentration region.

Next, a metal film containing Ni as a main component is formed by sputtering or the like, and then, a heat treatment at a temperature of 600 to 1100° C. is performed to react the metal film containing Ni as the main component with the silicon carbide semiconductor layer in the first contact hole 90 and the second contact hole 91 and thus form a silicide between the silicon carbide semiconductor layer and the metal film. Subsequently, a remaining metal film other than the silicide obtained through the reaction is removed by wet etching. The thus formed silicide forms the first ohmic electrode 70 and a second ohmic electrode 72.

Subsequently, a metal film containing Ni as a main component is formed on a back surface (second main surface) of the semiconductor substrate 10 and heat-treated to form a back-surface ohmic electrode (not shown) on the back side of the semiconductor substrate 10.

Next, the interlayer insulating film 55 on a first separation region 21 and the interlayer insulating film 55 at the positions to be the gate insulating film 50 and a gate contact hole 95 are removed using patterning by photoresist or the like. Employed as a removal method is wet etching that does not damage a surface of the silicon carbide layer that is to be a Schottky interface.

Subsequently, a metal film that is to be a Schottky electrode is deposited by sputtering or the like, and a first Schottky electrode 71 is formed on the first separation region 21 in the first contact hole 90 using patterning by photoresist or the like.

Next, a wiring metal such as Al is formed on a surface of the above-processed substrate by sputtering or vapor deposition and processed into a prescribed shape by a photolithography technique to form a source electrode 80 in contact with the source-end first ohmic electrode 70, the first Schottky electrode 71, and the second ohmic electrode 72, and a gate pad 82 and gate wiring 83 that are in contact with the gate electrode 60.

Further, a metal film as a drain electrode 84 is formed on a surface of the back-surface ohmic electrode formed on the back surface of the substrate to complete the silicon carbide semiconductor device according to the present embodiment shown in FIGS. 1 to 3.

Next described is operation in three states of the SiC-MOSFET with the built-in SBD as the silicon carbide semiconductor device according to the present embodiment.

A first state, which is hereinafter referred to as an "ON-state," involves cases in which a positive voltage is applied to the drain electrode 84 with respect to the source electrode 80 and a positive voltage that is greater than or equal to a threshold value is applied to the gate electrode 60.

In the ON-state, an inversion channel is formed in the channel region, and a path through which electrons serving as carriers flow is formed between the n-type source region 40 and the n-type second separation region 22. On the other hand, an electric filed in a direction in which current hardly flows for a Schottky junction, that is, a reverse direction (reverse bias) is applied to the SBD formed between the first Schottky electrode 71 and the first separation region 21, so that no current flows.

The electrons flowing from the source electrode 80 into the drain electrode 84 reach from the source electrode 80 to the drain electrode 84 through the first ohmic electrode 70, the source region 40, the channel region, the second separation region 22, the drift layer 20, and then the semiconductor substrate 10 according to the electric field formed by the positive voltage applied to the drain electrode 84.

Accordingly, application of a positive voltage to the gate electrode 60 flows ON-current from the drain electrode 84 to the source electrode 80. The voltage applied between the source electrode 80 and the drain electrode 84 at this time is referred to as an ON-voltage, and a value obtained by dividing the ON-voltage by the density of the ON-current is referred to as ON-resistance. The ON-resistance is equal to the total of resistance in the path through which the electrons flow. A product of the square of the ON-current and the ON-resistance is equal to a conduction loss consumed while the MOSFET is energized, so that the ON-resistance is preferably low. The ON-current only flows through the active region including the channel region and does not flow through an ineffective region other than the active region.

A second state, which is hereinafter referred to as an "OFF-state," involves cases in which a high voltage is applied to the drain electrode 84 with respect to the source electrode 80 and a voltage that is less than or equal to the threshold value is applied to the gate electrode 60.

In the OFF-state, inversion carriers are not formed in the channel region not to flow the ON-current, and the high voltage is applied between the source electrode 80 and the drain electrode 84 of the MOSFET. At this time, the voltage of the gate electrode 60 is almost equal to the voltage of the source electrode 80, so that the high voltage is also applied between the gate electrode 60 and the drain electrode 84.

In the active region during the OFF-state, reverse bias is applied to the p-n junction formed between the first well region 30 and the drift layer 20, and a thick depletion layer spreads toward the drift layer 20 having a relatively low concentration to prevent application of the voltage to the gate insulating film 50.

A depletion layer from the first well region 30 transversely extends to inverse the first separation region 21 not to allow application of the high voltage to the Schottky junction, so that high leakage current does not flow into the SBD (built-in SBD) formed between the first Schottky electrode 71 and the first separation region 21.

The gate insulating film 50 on the second separation region 22 does not have a p-type region directly under the gate insulating film and thus has an electric field applied thereto that is relatively higher than that applied to the gate insulating film 50 on the first well region 30. Appropriately setting the width of the second separation region 22, however, enables suppression of the electric field applied to the gate insulating film 50 during the OFF-state to less than or equal to a desired value by a depletion layer that transversely extends from the first well region 30 toward the second separation region 22. That is, low-resistance contact can be formed between the first well region 30 and the source electrode 80 to prevent a high-intensity electric field from being applied to the gate insulating film 50 on the first well region 30 during the OFF-state.

A thin depletion layer spreads not only to the drift layer 20 and the second separation region 22 but also to the p-type first well region 30 having a relatively high impurity concentration, so that the holes generated from the depletion layer formed in the first well region 30 are discharged into the source electrode 80 through the contact region 32 in a process of shifting from the ON-state to the OFF-state.

In a region of the ineffective region in which the gate pad 82 shown on a right side in FIG. 2 is disposed, formed are the second well region 31 formed in a region almost including the planar positions of the gate insulating film 50 and the field insulating film 51 that are formed on the ineffective region, and the second contact hole 91 for forming electrical connection between the second well region 31 and the source electrode 80 in a partial region of a surface layer within a planar area of the second well region 31. Similarly to the active region, this can prevent a high-intensity electric field from being applied to the gate insulating film 50 and the field insulating film 51 on the ineffective region.

At an outer peripheral part of the device in the ineffective region that is shown on a right side in FIG. 3, a part of the second well region 31 and the JTE region 37 as well as the drift layer 20 is depleted to relieve electric field concentration generated in the termination region (outer peripheral part) of the device and retain a withstand voltage. At this time, the holes generated in the depletion layer of the second well region 31 and the JTE region 37 are discharged into the source electrode 80 through the nearest second contact hole 91.

A third state involves cases in which free-wheeling current flows from the source electrode 80 toward the drain electrode 84 while a negative voltage is applied to the drain electrode 84 with respect to the source electrode 80, that is, a counter electromotive voltage is applied to the MOSFET. This state is hereinafter referred to as a "free-wheeling state".

In the free-wheeling state, an electric field in the forward direction (forward bias) is applied to the built-in SBD, and unipolar current formed of electron current flows from the first Schottky electrode 71 toward the first separation region 21 in the active region. When the voltage of the source electrode 80 with respect to the drain electrode 84 (source-drain voltage) is small, all the free-wheeling current flows through the built-in SBD not to cause injection of minority carriers from the first well region 30 into the drift layer 20. Accordingly, no current in the forward direction flows into the p-n diode between the first well region 30 and the drift layer 20 not to cause crystal defects due to carrier recombination energy and increase the ON-resistance.

When the voltage between the source electrode 80 and the drain electrode 84 further increases, and such voltage reaches a certain condition, however, the p-n diode formed between the first well region 30 and the drift layer 20 in the active region operates and minority carriers are injected into the drift layer 20 in the active region. This can result in generation of crystal defects.

The p-n diode that the second well region 31 positioned on the outer periphery of the active region forms with the drift layer 20 does not include the SBD in the p-n diode, so that the holes injected into the drift layer 20 by bipolar operation of the p-n diode formed between the second well region 31 and the drift layer 20 sometimes diffuse into the drift layer 20 in the adjacent active region to cause bipolar operation.

In the SiC-MOSFET with the built-in SBD as the silicon carbide semiconductor device according to the present invention, the second well region 31 has a p-type impurity concentration lower than the p-type impurity concentration in the first well region 30 and has the high-concentration region 33 formed therein, the high-concentration region having a resistance lower than that of the second well region 31. This configuration does not allow the p-n diode formed between the second well region 31 and the drift layer 20 to operate even in the free-wheeling state, so that minority carriers are not generated in the vicinity of the first well region 30 adjacent to the second well region 31 to enable suppression of generation of crystal defects in the vicinity of the first well region 30 adjacent to the second well region 31 and prevention of a rise in ON-resistance.

Further, when the holes generated in the depletion layer of the second well region 31 and the JTE region 37 are discharged into the source electrode 80 through the second contact hole 91 during switching from the "ON-state" to the "OFF-state," current due to movement of the holes and a voltage due to resistance of the current's path (voltage due to displacement current) are generated. In the SiC-MOSFET with the built-in SBD according to the present invention, however, the second well region 31 has the high-concentration region 33 formed therein to prevent the voltage due to the displacement current from causing an insulation breakdown of the gate insulating film 50 formed between the gate electrode 60 and the high-concentration region 33 or the second well region, so that it is possible to increase reliability of the silicon carbide semiconductor device.

As described above, the SiC-MOSFET with the built-in SBD as the silicon carbide semiconductor device according to the present embodiment of the present invention is capable of preventing a rise in ON-resistance and a decrease in reliability due to an insulation breakdown of the gate insulating film.

The present embodiment shows an example of performing the ion implantation steps in a prescribed order. The order of the ion implantation steps, however, may be appropriately changed.

In addition, the ion implantation for forming the contact region 32 is shown as a separate step from the ion implantation for forming the high-concentration region 33. These ion implantation steps, however, may be simultaneously performed at one time and the impurity concentration and the thickness may be the same between the contact region 32 and the high-concentration region 33.

In addition, the order of forming the back-surface ohmic electrode and the front-surface ohmic electrodes (first and second), and the Schottky electrode (first) may be appropriately changed.

In the present embodiment, exemplified as the silicon carbide semiconductor device is a SiC-MOSFET with a built-in SBD, with the n-type employed as the first conductivity-type and the p-type as the second conductivity-type. The silicon carbide semiconductor device, however, may be a SiC-insulated gate bipolar transistor (IGBT) with a built-in SBD, which also exerts similar effects. The first conductivity-type and the second conductivity-type may be the other way around.

Second Embodiment

The first embodiment describes an example of forming no Schottky electrode in the second well region 31 of the ineffective region. The Schottky electrode, however, may be formed in the second well region 31. In a silicon carbide semiconductor device according to a present embodiment, a Schottky electrode is formed in the second well region 31. Other configurations are similar to those in the first embodiment and thus detailed description is omitted.

Figure 5:
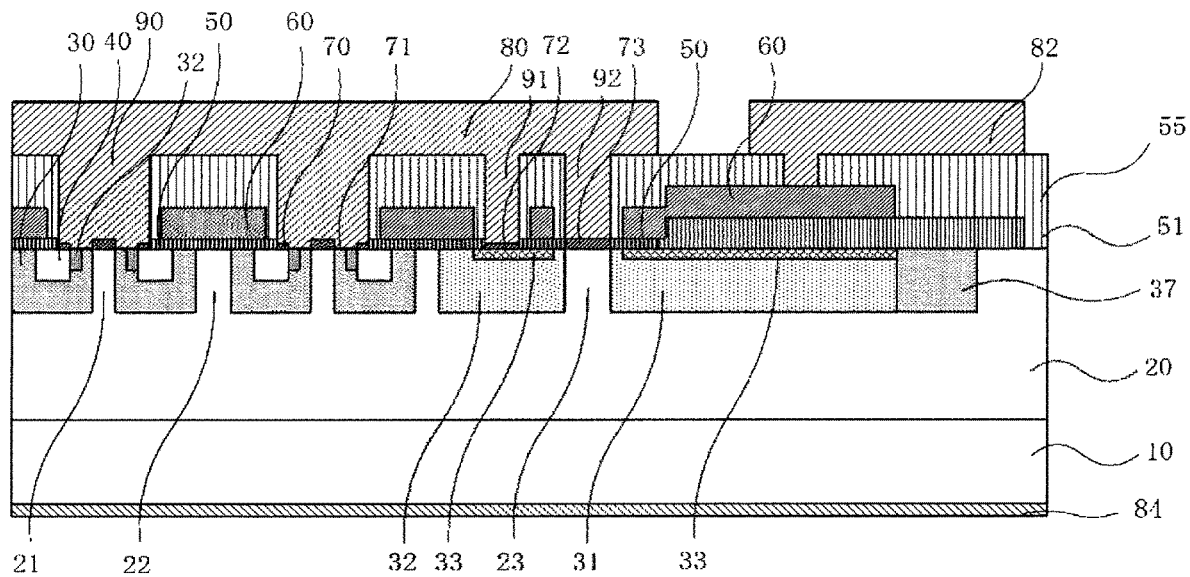
FIG. 5 is a schematic sectional view of the silicon carbide semiconductor device according to the second embodiment of the present invention.

FIG. 4 is a schematic sectional view of the silicon carbide semiconductor device according to the present embodiment that schematically shows the section along the a-a' part from the gate pad 82 to the source electrode 80 in FIG. 1 used for describing the first embodiment. FIG. 5 is a schematic sectional view of the silicon carbide semiconductor device according to the present embodiment that schematically shows the section along the b-b' part from the source electrode 80 to the outer peripheral part of the device in FIG. 1.

In FIGS. 4 and 5, a third separation region 23 is formed in the second well region 31 and a second Schottky electrode 73 is formed on a surface of the third separation region 23. The second Schottky electrode 73 is connected to the source electrode 80.

The high-concentration region 33 formed on a surface layer of the second well region 31 is formed away from the third separation region 23.

The second Schottky electrode 73 may be formed simultaneously with the first Schottky electrode 71 by the same method as that for the first Schottky electrode described in the first embodiment.

Figure 6:
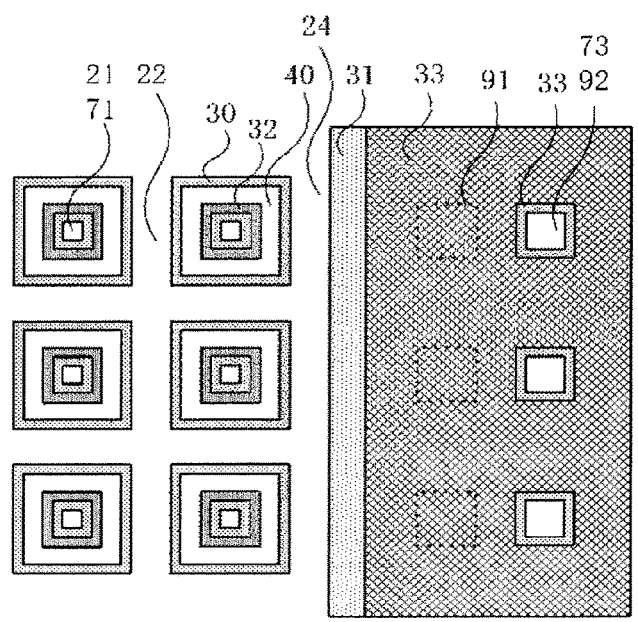
FIG. 6 is an enlarged schematic plan view of the silicon carbide semiconductor device according to the second embodiment of the present invention.
Figure 7:
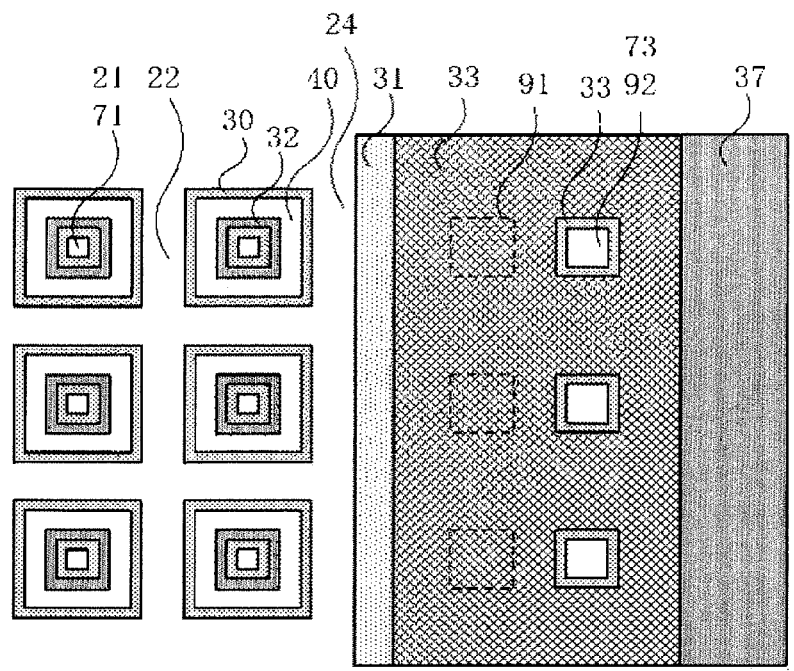
FIG. 7 is an enlarged schematic plan view of the silicon carbide semiconductor device according to the second embodiment of the present invention.
Figure 8:
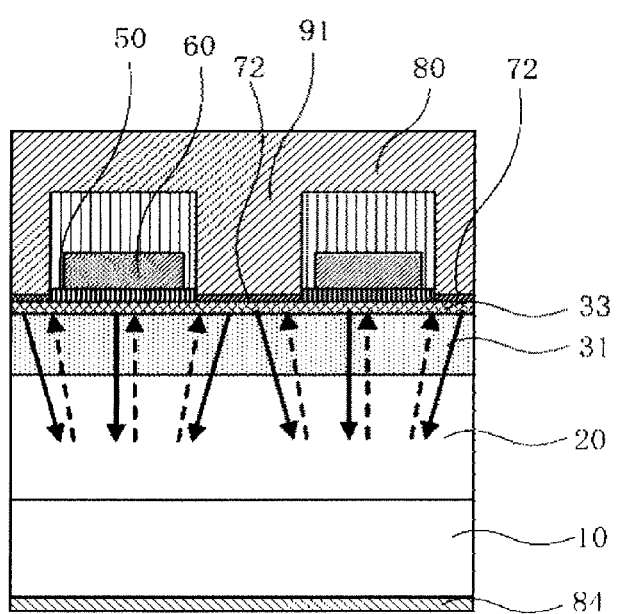
FIG. 8 is a schematic sectional view illustrating motion of electrons and holes in the silicon carbide semiconductor device according to the second embodiment of the present invention.

FIGS. 6 and 7 are enlarged schematic plan views of the a-a' part and the b-b' part, respectively, in FIG. 1 of the silicon carbide semiconductor device according to the present embodiment. FIG. 8 is a sectional view schematically illustrating motion of electrons and holes in a section across a second contact hole 91 of FIGS. 6 and 7.

In FIG. 6, a plurality of second contact holes 91 are arranged vertically to an inward direction in which the first well region 30 is located, and are provided separately within the high-concentration region 33 in the second well region 31. On the outer side of the second contact holes 91, a plurality of second Schottky electrodes 73 and third contact holes 92 are provided vertically to the inward direction in which the first well region 30 is located, and separately.

In FIG. 7, the JTE region 37 is, in addition to the arrangement of FIG. 6, formed on the outer side of the second well region 31 and the high-concentration region 33.

FIG. 8 showing a section across a second contact hole 91 in FIGS. 6 and 7 illustrates motion of holes in the free-wheeling state by the solid arrows and motion of electrons in the free-wheeling state by the dashed arrows.

Although current eventually flows into the second contact hole 91 in the free-wheeling state to somewhat concentrate the holes and the electrons in the second contact hole 91 part, the high-concentration region 33 provided allows the current to flow along this section almost uniformly as shown in FIG. 8.

As described above, in the SiC-MOSFET with the built-in SBD as the silicon carbide semiconductor device according to the present embodiment, the Schottky electrode is formed in the second well region 31. Such a configuration allows, during the free-wheeling operation, an electric field in the forward direction (forward bias) to be applied to the built-in SBD even in the ineffective region having the second well region 31 provided therein and unipolar current formed of electron current to flow from the second Schottky electrode 73 toward the third separation region 23.

When the voltage of the source electrode 80 with respect to the drain electrode 84 (source-drain voltage) is small, all the free-wheeling current flows through the built-in SBD not to cause injection of minority carriers from the second well region 31 into the drift layer 20. Accordingly, no current in the forward direction flows into the p-n diode between the second well region 31 and the drift layer 20 not to cause crystal defects due to carrier recombination energy.

Further, even when the p-n diode formed between the second well region 31 and the drift layer 20 operates and minority carriers are injected into the drift layer 20 when the voltage between the source electrode 80 and the drain electrode 84 further increases, and such voltage reaches a certain condition, the second well region 31 has a p-type impurity concentration lower than the p-type impurity concentration in the first well region 30 to enable further suppression of the ON-state of the p-n diode formed between the second well region 31 and the drift layer 20.

In the outer peripheral region shown in FIG. 7, a part of the second well region 31 and the JTE region 37 provided on the outer peripheral side of the second well region, as well as the drift layer 20 is depleted to enable relief of electric field concentration in the outer peripheral part of the device and further suppression of a decrease in withstand voltage.

Also in the outer peripheral part (termination region) of the device, the holes generated in the depletion layer of the second well region 31 and the JTE region 37 are ejected to the source electrode 80 through the nearest second contact hole 91. In addition, the high-concentration region 33 formed in the second well region 31 is capable of suppressing generation of a high voltage on the gate insulating film 50 between the high-concentration region 33 or the second well region 31 and the gate electrode 60 to give a high-reliability silicon carbide semiconductor device.

In addition, the third separation region 23 in the second well region 31 prevents generation of leakage current in the OFF-state, so that the width of the third separation region may be set to such a width that allows the depletion layer extending from the second well region 31 during the OFF-time to fill the third separation region 23.

Third Embodiment

In a SiC-MOSFET with a built-in SBD as a silicon carbide semiconductor device according to a present embodiment, as regards the structure of the outer peripheral part adjacent to the active region, a third contact hole 92 is disposed between second contact holes 91 provided away from each other, whereas the third contact hole 92 is disposed on the outer side of the second contact hole 91 in the second embodiment. Other configurations are similar to those in the SiC-MOSFET with the built-in SBD of the second embodiment and thus detailed description is omitted.

Figure 9:
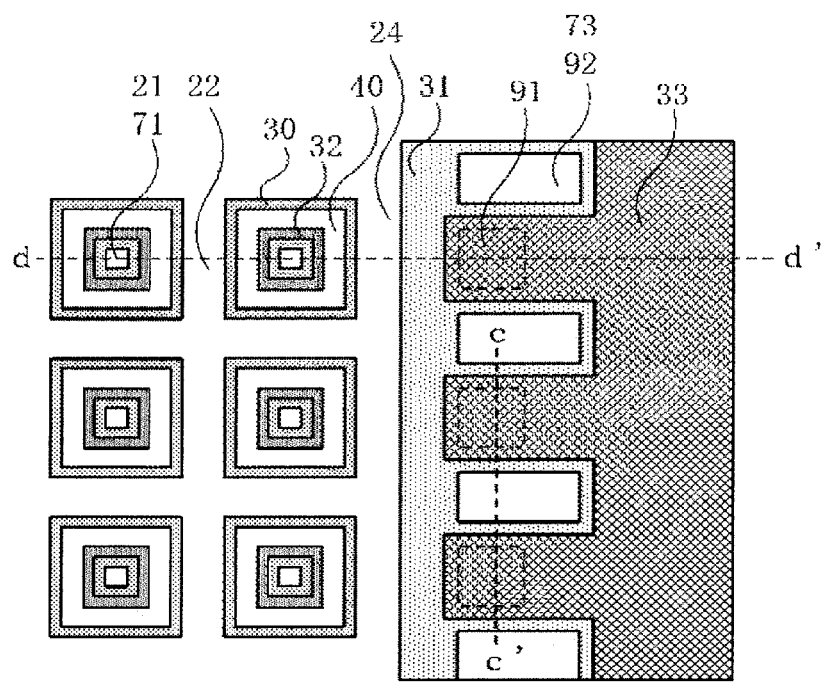
FIG. 9 is a partially enlarged schematic plan view of a silicon carbide semiconductor device according to a third embodiment of the present invention.
Figure 10:
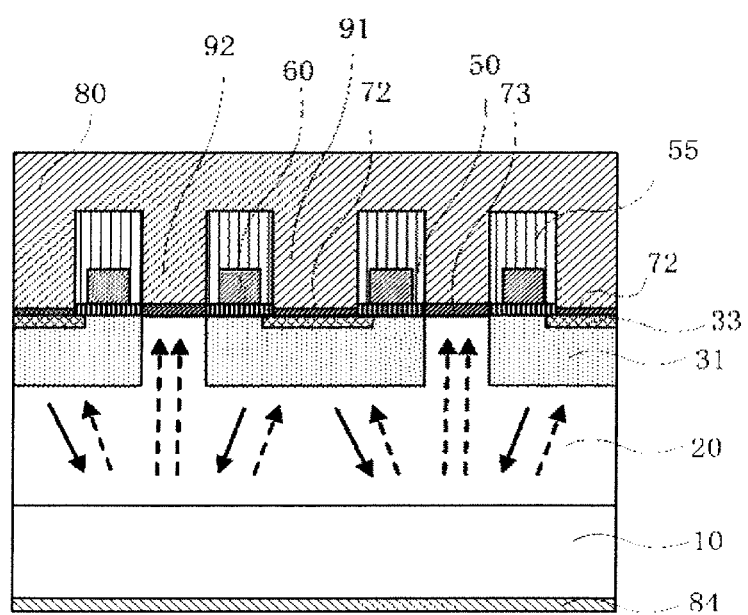
FIG. 10 is a schematic sectional view of the silicon carbide semiconductor device according to the third embodiment of the present invention.
Figure 11:
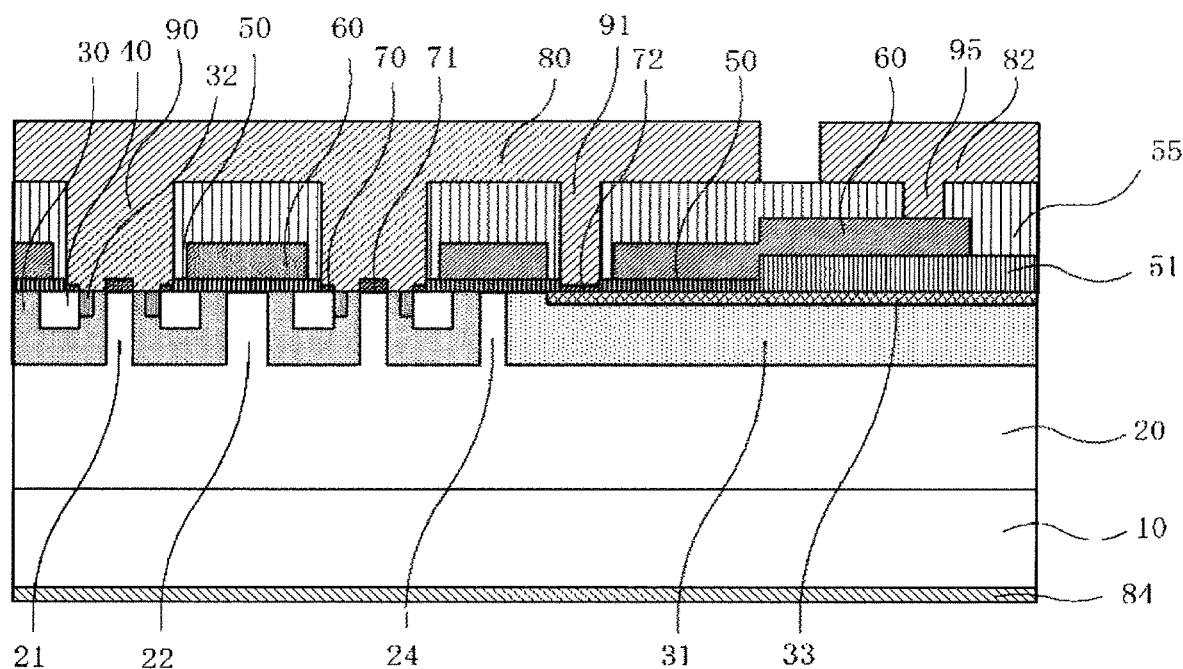
FIG. 11 is a schematic sectional view of the silicon carbide semiconductor device according to the third embodiment of the present invention.

FIG. 9 is a schematic top plan view of the SiC-MOSFET with the built-in SBD according to the present embodiment, at the a-a' part from the gate pad 82 to the source electrode 80 in FIG. 1 used for describing the first embodiment. FIGS. 10 and 11 are schematic sectional views of the c-c' part and the d-d' part, respectively, in FIG. 9 and FIG. 10 illustrates motion of holes in the free-wheeling state by the solid arrows and motion of electrons in the free-wheeling state by the dashed arrows. In FIG. 9, a plurality of third contact holes 92 are provided away from each other in regions having the second well region 31 formed on surfaces thereof, the high-concentration region 33 is formed on a surface of each region between third contact holes 92, and the second contact hole 91 is formed in the region between the third contact holes.

In FIG. 10, electrons move toward the third contact hole 92 during the free-wheeling state and lower-concentration electrons and holes are recombined in the drift layer 20. As described above, in the silicon carbide semiconductor device according to the present embodiment, the second contact hole 91 is disposed to be sandwiched between the third contact holes 92 to enable reduction of the area of the second well region 31 and a further increase in rate of the unipolar current that flows through the second contact hole 91.

As described above, the silicon carbide semiconductor device according to the present embodiment is capable of limiting the path, that is, the planar area of the current that flows from the second contact hole 91 into the drift layer 20 and increasing resistance to the current that flows through the second well region 31. In addition, the third contact hole 92 provided with the second Schottky electrode 73 is disposed on both sides of the second contact hole 91 to enable a further increase in ratio of the unipolar current that flows through the third contact hole 92 compared with the bipolar current that flows from the second contact hole 91.

This results in suppressing the current that flows from the second ohmic electrode 72 into the semiconductor substrate 10 through the second well region 31 and the drift layer 20 during the free-wheeling state to enable suppression of the ON-operation of the p-n diode formed between the drift layer 20 and the second well region 31.

Fourth Embodiment

The first to third embodiments describe an example including the second well region 31 that has a prescribed impurity concentration lower than the impurity concentration in the first well region 30. The present embodiment, however, includes, at a bottom of the second well region 31, a high-concentration well bottom surface region 38 that has a concentration higher than that of the second well region 31 and is of p-type. Other configurations are similar to those in the first to third embodiments and thus detailed description is omitted.

Figure 12:
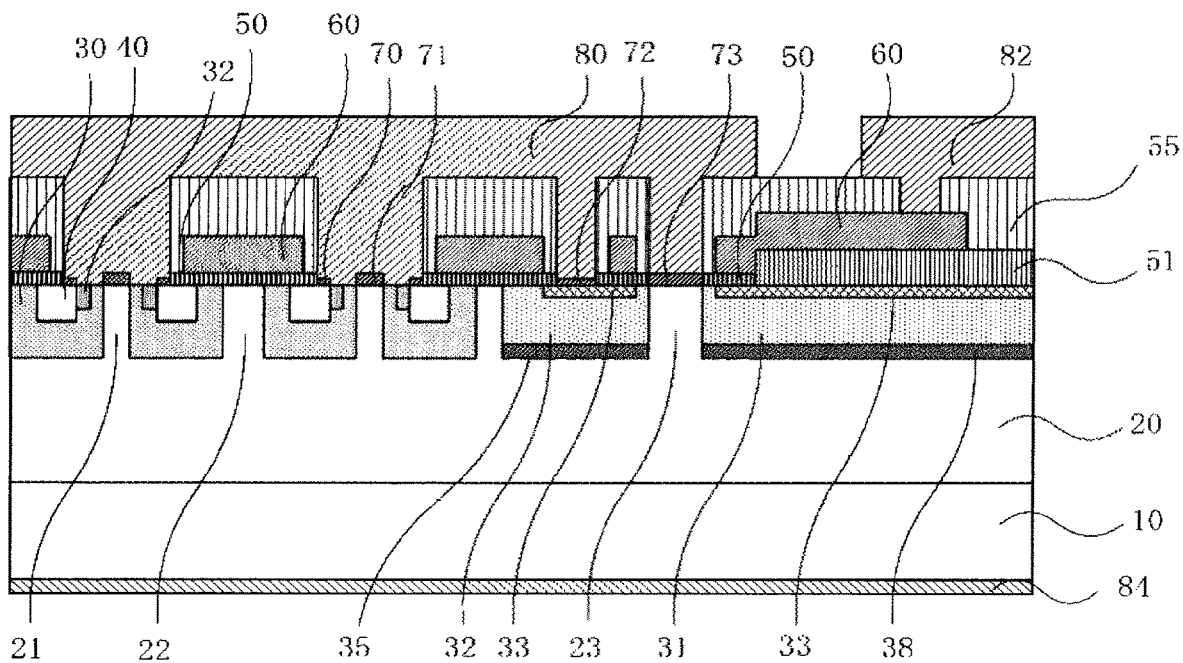
FIG. 12 is a schematic sectional view of a silicon carbide semiconductor device according to a fourth embodiment of the present invention.

FIG. 12 is a schematic sectional view of a SiC-MOSFET with a built-in SBD according to the present embodiment, along the a-a' part from the gate pad 82 to the source electrode 80 in FIG. 1 used for describing the first embodiment. In FIG. 12, the high-concentration well bottom surface region 38 that has a concentration higher than that of the second well region 31 and is of p-type is provided at the bottom of the second well region 31.

The silicon carbide semiconductor device according to the present embodiment allows the electrons injected from the drift layer 20 into the high-concentration well bottom surface region 38 to recombine with high-concentration holes in the high-concentration well bottom surface region 38 and thus annihilate, and is thus capable of flowing unipolar current of holes into the second well region 31. The second well region 31 has a resistance higher than that of the first well region 30 to generate a larger drop in voltage in the current path.

This results in reducing the vertical current that flows from the second ohmic electrode 72 to the semiconductor substrate 10 through the second well region 31 and the drift layer 20 during the free-wheeling state to enable suppression of the ON-operation of the p-n diode between the second well region 31 and the drift layer 20.

The high-concentration well bottom surface region 38 that has a resistance lower than that of the second well region 31 is, together with the high-concentration region 33, capable of reducing planar resistance of the second well region 31, reducing the high voltage generated due to displacement current during high dV/dt, and suppressing an insulation breakdown of the gate insulating film 50 between the second well region 31 and the gate electrode 60.

The SiC-MOSFET with the built-in SBD as the silicon carbide semiconductor device according to the present embodiment can be manufactured by ion-planting a p-type impurity such as Al at a position corresponding to the bottom of the second well region 31, with use of an implantation mask used for forming the second well region 31. The high-concentration well bottom surface region 38 may have an impurity concentration of, for example, $1\times10^{17}$ to $1\times10^{21}$ cm$^{-3}$.

Fifth Embodiment

The fourth embodiment shows an example of forming the high-concentration well bottom surface region 38 at the bottom of the second well region 31. In the present embodiment, however, a bottom high-concentration crystal defect region 39 of the second well region 31 is formed in place of the high-concentration well bottom surface region 38. Other configurations are similar to those in the fourth embodiment and thus detailed description is omitted.

Figure 13:
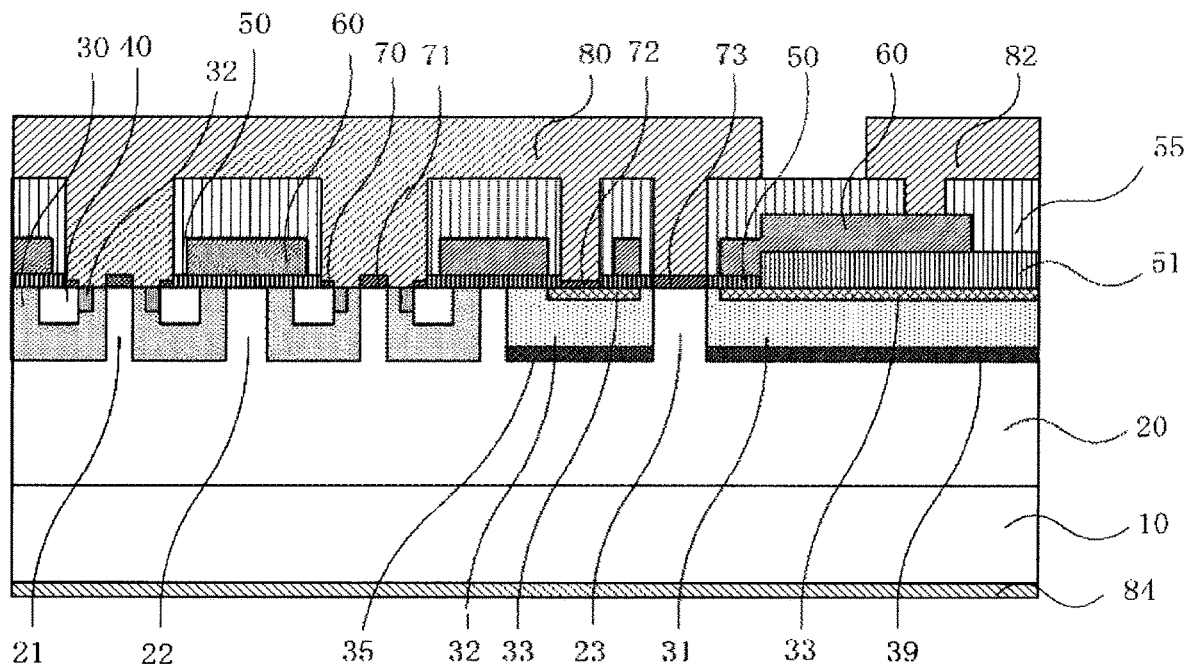
FIG. 13 is a schematic sectional view of a silicon carbide semiconductor device according to a fifth embodiment of the present invention.

FIG. 13 is a schematic sectional view of a SiC-MOSFET with a built-in SBD according to the present embodiment, along the a-a' part from the gate pad 82 to the source electrode 80 in FIG. 1 used for describing the first embodiment. In FIG. 13, the bottom high-concentration crystal defect region 39 that has a concentration higher than that of the second well region 31 and is of p-type is provided at the bottom of the second well region 31.

The bottom high-concentration crystal defect region 39 includes many crystal defects and is formed by implanting, for example, Ar ions. The implantation of Ar ions is performed directly before the ion implantation for forming the second well region 31 described in the first embodiment.

The silicon carbide semiconductor device according to the present embodiment allows the electrons injected from the drift layer 20 into the bottom high-concentration crystal defect region 39 to recombine with holes by the crystal defects existing in the bottom high-concentration crystal defect region 39 and thus annihilate. This results in flowing unipolar current of holes into the second well region 31. The second well region 31 has a resistance higher than that of the first well region 30 to generate a larger drop in voltage in the current path. Further, the bottom high-concentration crystal defect region 39 increases its resistance due to the crystal defects.

This results in reducing the vertical current that flows from the second ohmic electrode 72 to the semiconductor substrate 10 through the second well region 31 and the drift layer 20 during the free-wheeling state to enable suppression of the ON-operation of the p-n diode between the second well region 31 and the drift layer 20.

The first to fifth embodiments describe the first well region 30 and the second well region 31 that are separated from each other. A part or the whole of the first well region 30, however, may be connected to the second well region 31.

When the first well region 30 is connected to the second well region 31, referred to as the first well region 30 is a region that has the source region 40 and the first Schottky electrode 71 formed therein and covers within 20 µm from the first Schottky electrode 71 transversely in section.

The first to fifth embodiments describe the devices with the n-type employed as the first conductivity-type and the p-type as the second conductivity-type. The present invention, however, is not limited to this employment and a device with the p-type employed as the first conductivity-type and the n-type as the second conductivity-type also exerts similar effects. N used as the n-type (first conductivity-type) impurity may be replaced by phosphorus or arsenic. Further, Al used as the p-type (second conductivity-type) impurity may be replaced by boron or gallium.

In the MOSFETs described in the first to fifth embodiments, the gate insulating film is not necessarily an oxide film such as $SiO_2$, and may be an insulating film other than the oxide film or a combination of an insulating film other than the oxide film with the oxide film. In addition, silicon oxide obtained by thermally oxidizing silicon carbide is used as the gate insulating film 50, but the gate insulating film may be silicon oxide as a film deposited by a CVD method.

In addition, the present invention is also applicable to a MOSFET having a super junction structure.

The embodiments describe the so-called vertical MOSFETs including the drain electrode formed on the back surface of the semiconductor substrate 10. The present invention, however, can also be used in a so-called lateral MOSFET such as a RESURF MOSFET including the drain electrode on a surface of the drift layer 20.

In addition, the embodiments describe the MOSFETs including the gate insulating film 50. The present invention, however, is applicable to any unipolar devices and can be used in a junction FET (JFET) or a metal-semiconductor field effect transistor (MESFET) that does not include the gate insulating film 50 but includes the field insulating film 51.

Further, the embodiments show the source-end first ohmic electrode 70 and the first Schottky electrode 71 prepared to be separated from each other. The electrodes, however, may be formed continuously with an identical material or different materials.

The present embodiments describe the devices using specific examples of the crystal structure, the plane direction of the main surface, the off-angle, and the implantation conditions. The application range of the present invention, however, is not limited to the exemplified numerical ranges.

Sixth Embodiment

The present embodiment is application of a silicon carbide semiconductor device according to the first to fifth embodiments to a power conversion device. The present invention is not limited to a specific power conversion device, and described hereinafter as the sixth embodiment is cases of applying the present invention to a three-phase inverter.

Figure 14:
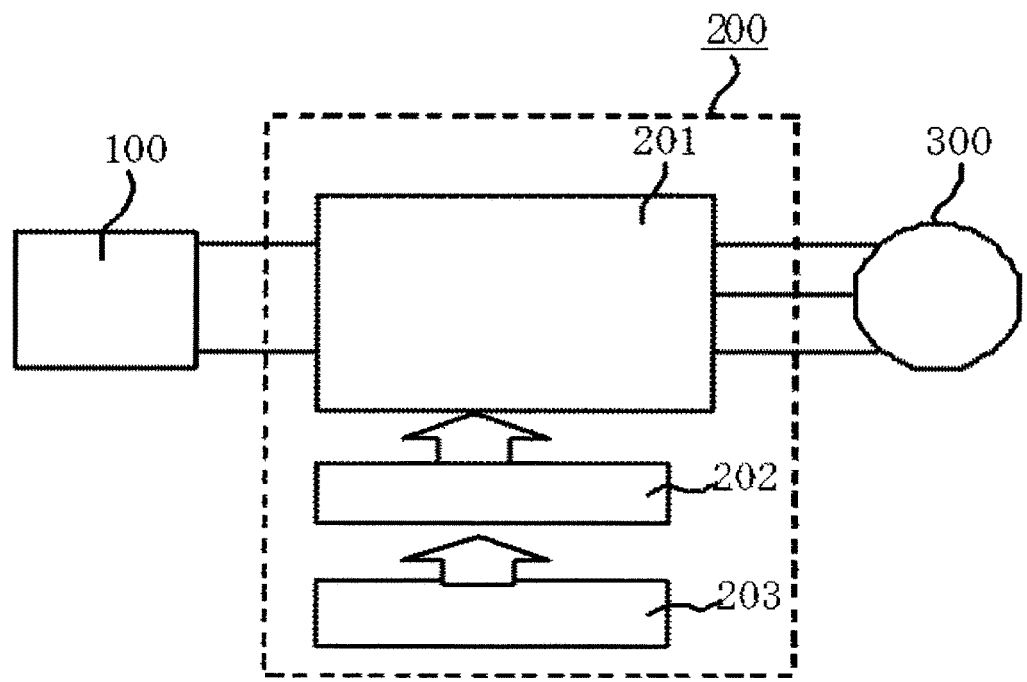
FIG. 14 is a schematic view showing a configuration of a power conversion device according to a sixth embodiment of the present invention.

FIG. 14 is a block diagram showing a configuration of a power conversion system having the power conversion device according to the present embodiment applied thereto.

The power conversion system shown in FIG. 14 is formed of a power source 100, a power conversion device 200, and a load 300. The power source 100 is a direct-current power source and supplies direct-current power to the power conversion device 200. The power source 100 can be formed of various sorts of constituent elements such as a direct-current system, a solar battery, and a storage battery and may be formed of a rectifier circuit or an AC/DC converter connected to an alternating-current system. In addition, the power source 100 may be formed of a DC/DC converter that converts direct-current power output from a direct-current system to prescribed power.

The power conversion device 200 is a three-phase inverter connected between the power source 100 and the load 300, converts direct-current power supplied from the power source 100 to alternating-current power, and supplies the alternating-current power to the load 300. The power conversion device 200 includes, as shown in FIG. 14, a main conversion circuit 201 that converts direct-current power to alternating-current power and outputs the alternating-current power, a driving circuit 202 that outputs driving signals for driving switching devices of the main conversion circuit 201, and a control circuit 203 that outputs a control signal for controlling the driving circuit 202 to the driving circuit 202.

The load 300 is a three-phase electric motor driven by the alternating-current power supplied from the power conversion device 200. The load 300 is not limited to specific application, but is an electric motor incorporated in various electric devices and is used as an electric motor for, for example, a hybrid vehicle, an electric vehicle, a rail vehicle, an elevator, or air-conditioning equipment.

Hereinafter, the power conversion device 200 is described in detail. The main conversion circuit 201 includes a switching device and a free wheel diode (not shown). Upon switching of the switching device, the direct-current power supplied from the power source 100 is converted to alternating-current power, which is supplied to the load 300. There are various specific circuit configurations for the main conversion circuit 201, but the main conversion circuit 201 of the present embodiment is a two-level three-phase full bridge circuit and can be formed of six switching devices and six free wheel diodes in anti-parallel connection with the six switching devices. The silicon carbide semiconductor device according to any one of the first to fifth embodiments is applied to the switching devices of the main conversion circuit 201. Every two switching devices of the six switching devices are connected in series to configure upper and lower arms, and the pairs of upper and lower arms constitute respective phases (a U phase, a V phase, and a W phase) of the full bridge circuit. Output terminals of the pairs of upper and lower arms, that is, three output terminals of the main conversion circuit 201 are connected to the load 300.

The driving circuit 202 generates a driving signal for driving a switching device of the main conversion circuit 201 and supplies the driving signal to a control electrode of the switching device of the main conversion circuit 201. Specifically, according to a control signal from the control circuit 203 described later, the driving circuit outputs a driving signal for setting a switching device to an ON-state and a driving signal for setting a switching device to an OFF-state to the control electrode of each of the switching devices.

When the switching device is kept at the ON-state, the driving signal is a voltage signal that is greater than or equal to a threshold voltage of the switching device (ON-signal). When the switching device is kept at the OFF-state, the driving signal is a voltage signal that is less than or equal to the threshold voltage of the switching device (OFF-signal).

The control circuit 203 controls the switching devices of the main conversion circuit 201 so that desired power is supplied to the load 300. Specifically, a time (ON-time) for which each of the switching devices of the main conversion circuit 201 is to be in the ON-state is calculated on the basis of the power to be supplied to the load 300. For example, it is possible to control the main conversion circuit 201 by PWM control for modulating the ON-time of a switching device according to the voltage to be output. Then, the control circuit outputs a control command (control signal) to the driving circuit 202 so that the driving circuit outputs, at each time point, the ON-signal to a switching device to be in the ON-state and the OFF-signal to a switching device to be in the OFF-state. The driving circuit 202 outputs the ON-signal or the OFF-signal as a driving signal to the control electrode of each of the switching devices according to the control signal.

The power conversion device according to the present embodiment adopts, as the switching devices of the main conversion circuit 201, a silicon carbide semiconductor device according to the first to fifth embodiments, so that it is possible to realize a power conversion device that has a low loss and is improved in reliability of high-speed switching.

The present embodiment describes an example of applying the present invention to a two-level three-phase inverter. The present invention, however, is not limited to this example and is applicable to various power conversion devices. The present embodiment describes a two-level power conversion device, but the present invention may be applied to a three-level or multilevel power conversion device, and is also applicable to a single-phase inverter when power is supplied to a single-phase load. In addition, the present invention is also applicable to a DC/DC converter or an AC/DC converter when power is supplied to, for example, a direct-current load.

The power conversion device that adopts the present invention is not limited to the above-described case of employing an electric motor as the load but can be applied as a power supply device of, for example, an electric discharge machine or a laser beam machine, or an induction heating cooker or a non-contact power supply system. Furthermore, it is also possible to use the power conversion device as a power conditioner of, for example, a solar photovoltaic generation system or a power storage system.

EXPLANATION OF REFERENCE SIGNS

10: semiconductor substrate
20: drift layer
21: first separation region
22: second separation region
23: third separation region
24: fourth separation region
30: first well region
31: second well region
32: contact region
33: high-concentration region
37: JTE region
38: high-concentration well bottom surface region
39: bottom high-concentration crystal defect region
40: source region
50: gate insulating film
51: field insulating film
55: interlayer insulating film
60: gate electrode
70: first ohmic electrode
71: first Schottky electrode
72: second ohmic electrode
73: second Schottky electrode
80: source electrode, source pad
82: gate pad
83: gate wiring
84: drain electrode
90: first contact hole
91: second contact hole
92: third contact hole
95: gate contact hole
100: power source
200: power conversion device
201: main conversion circuit
202: driving circuit
203: control circuit
300: load

The invention claimed is:

1. A silicon carbide semiconductor device comprising;
a semiconductor substrate made of a first conductivity type silicon carbide;
a drift layer formed on the semiconductor substrate and made of a first conductivity type silicon carbide;
a plurality of first well regions of a second conductivity type that are provided separately from each other on a surface layer of the drift layer;
a first separation region of a first conductivity type between the first well regions on a surface layer of the drift layer;
a source region of a first conductivity type formed, on the surface layer of the first well region, to sandwich the first separation region with another source region in a plan view;
a first Schottky electrode provided on the first separation region and Schottky-connected to the first separation region;
a first ohmic electrode formed on the source region and ohmic-connected to the source region;
a second separation region of a first conductivity type provided between the plurality of first well regions on the surface layer of the drift layer;
a second well region of a second conductivity type formed on the surface layer of the drift layer, and located at an outer periphery of an active region corresponding to a region where the plurality of first well regions are formed, and having an area larger than an area of the first well region;
a high-concentration well bottom surface region formed at a lower portion of the second well region and including a second conductivity-type impurity having a concentration higher than the second conductivity-type impurity concentration in the second well region;
a high-concentration of a second conductivity type region formed on a surface layer in the second well region and including a second conductivity-type impurity having an impurity concentration higher than the second conductivity-type impurity concentration in the first well region;
a second ohmic electrode formed on the high-concentration region, and ohmic-connected to the high-concentration region;
a gate insulating film formed on surfaces of the second separation region, the first well region, a part of the source region, and the second well region;
a gate electrode formed on the gate insulating film on the first well region and the second well region or the high-concentration region;
a source electrode connected to the first Schottky electrode, the first ohmic electrode, and the second ohmic electrode and ohmic-connected to the first well region and the second well region;
a gate pad connected to the gate electrode; and a drain electrode ohmic-connected to the semiconductor substrate.

2. The silicon carbide semiconductor device according to claim 1, wherein the second conductivity-type impurity concentration in the second well region is lower than the second conductivity-type impurity concentration in the first well region.

3. The silicon carbide semiconductor device according to claim 1, further comprising:
   a third separation region of a first conductivity type formed, in the second well region, to penetrate along depth of the second well region from the surface layer of the second well region; and
   a second Schottky electrode provided on the third separation region and Schottky-connected to the third separation region and connected to the source electrode.

4. The silicon carbide semiconductor device according to claim 3, wherein the second ohmic electrode is disposed to be sandwiched between a plurality of the second Schottky electrodes.

5. The silicon carbide semiconductor device according to claim 1, further comprising a JTE region of a second conductivity type having a second conductivity-type impurity concentration lower than the second conductivity-type impurity concentration in the second well region, on a side of the second well region that is opposite to the first well region, on a surface side of the drift layer.

6. A power conversion device comprising:
   the silicon carbide semiconductor device according to claim 1;
   a main conversion circuit that converts input power and outputs converted power;
   a driving circuit that outputs a driving signal for driving the silicon carbide semiconductor device to the silicon carbide semiconductor device; and
   a control circuit that outputs a control signal for controlling the driving circuit to the driving circuit.

\* \* \* \* \*